United States Patent [19]

Ebata

[11] Patent Number: 4,757,033
[45] Date of Patent: Jul. 12, 1988

[54] SEMICONDUCTOR DEVICE MANUFACTURING BY SEQUENTIAL ION AND WET ETCHINGS PRIOR TO LIFT-OFF METALLIZATION

[75] Inventor: Toshiki Ebata, Osaka, Japan

[73] Assignee: Sumitomo Electric Industries, Ltd., Osaka, Japan

[21] Appl. No.: 846,090

[22] Filed: Mar. 31, 1986

[51] Int. Cl.$^4$ .......................................... H01L 21/441
[52] U.S. Cl. ..................... 437/228; 437/238; 437/241; 437/944; 156/644; 156/653
[58] Field of Search ............. 148/DIG. 100; 156/643, 156/644, 646, 653; 437/228, 235, 238, 241, 944

[56] References Cited

U.S. PATENT DOCUMENTS

| | | | |
|---|---|---|---|
| 4,440,804 | 4/1984 | Milgram | 427/38 X |
| 4,451,971 | 6/1984 | Milgram | 437/944 |
| 4,484,978 | 11/1984 | Keyser | 156/643 |
| 4,497,684 | 2/1985 | Sebesta | 156/643 |
| 4,519,872 | 5/1985 | Anderson, Jr. et al. | 156/643 |
| 4,532,002 | 7/1985 | White | 156/643 |
| 4,533,431 | 8/1985 | Dargent | 156/643 |
| 4,539,222 | 9/1985 | Anderson, Jr. et al. | 427/88 |
| 4,564,997 | 1/1986 | Matsuo et al. | 29/576 W |
| 4,575,402 | 3/1986 | Marcoux et al. | 156/643 |

FOREIGN PATENT DOCUMENTS

| | | |
|---|---|---|
| 49-132987 | 12/1974 | Japan . |
| 50-1514 | 1/1975 | Japan . |
| 50-56885 | 5/1975 | Japan . |
| 52-154351 | 12/1977 | Japan . |
| 58-41775 | 9/1983 | Japan . |

Primary Examiner—Olik Chaudhuri
Attorney, Agent, or Firm—Cushman, Darby & Cushman

[57] ABSTRACT

The semiconductor device includes a semiconductor substrate, a two-layer insulating film formed on the substrate and constituted by upper and lower insulating layers made of insulating materials different, in chemical properties, from each other, respectively, an electrode and a first level interconnection such that the electrode and the first level interconnection are embedded in an opening formed on the two-layer insulating film.

5 Claims, 4 Drawing Sheets

SEMICONDUCTOR DEVICE MANUFACTURING BY SEQUENTIAL ION AND WET ETCHINGS PRIOR TO LIFT-OFF METALLIZATION

BACKGROUND OF THE INVENTION

The present invention generally relates to a semiconductor device and a method of manufacturing the semiconductor device and more particularly, to a semiconductor device of flat configuration suitable for multilayer interconnection and a method of manufacturing the semiconductor device in which, by employing a lift-off method in an integrated circuit, an electrode and a first level interconnection are formed at a high yield.

In the case where a field effect transistor (FET) or an integrated circuit is produced on a substrate made of compound semiconductor, a lift-off method is generally employed for forming various electrodes or a first level interconnection on a surface of the substrate. If a wet etching method used generally in the manufacture of a large scale integrated circuit (LSI) made of Si, i.e., a method in which metal of the electrodes or metal of the first level interconnection is etched by using acid or basic agent is applied to the manufacture of the substrate made of compound semiconductor, chemical reaction between the agent and the substrate takes place. Furthermore, in view of the fact that micro processing of accuracy similar to that for the manufacture of a very large scale integrated circuit (VLSI) made of Si is required for the manufacture of the substrate made of compound semiconductor, the wet etching method is improper for the manufacture of the substrate made of compound semiconductor. In order to microminiaturize the substrate made of compound semiconductor, a so-called plasma etching method using, in place of the agent, ions generated in gas plasma or a reactive ion etching method is proposed. However, these two known methods have the same problem as the wet etching method because the substrate made of compound semiconductor has low a selectively for materials to be etched. Furthermore, the two known methods are inevitably disadvantageous in that the substrate made of compound semiconductor may be damaged through plasmatic irradiation or ion bombardment thereto.

In order to reduce electric resistances of electrodes and wires in microminiaturization of an integrated circuit, the electrodes and the wires are required to be increased in thickness. At this time, if the lift-off method is employed for forming the electrodes and the wires, burrs 30, for example, are produced on a gate electrode 2 as shown in FIGS. 1(A) and 1(B). If the gate electrode 2 is used for multilayer interconnection without removing the burrs 30 from the gate electrode 2, a layer insulation film is damaged at its portions confronting the burrs 30 or concentration of electric field occurs between upper and lower wires, a shortcircuiting phenomenon takes place, thereby resulting in a drop in yield of the integrated circuit. In FIG. 1(A), reference numeral 21 represents a photoresist.

In order to remove the above-described burrs 30 from the gate electrode 2, a multilayer resist method shown in FIGS. 2(A) to 2(D) schematically illustrating its manufacturing process is put to trial. The multilayer resist method aims to prevent production of the burrs 30 by increasing the thickness of the resist for use in the lift-off and, at the same time, forming a cross section of the resist into a trapezoidal shape. However, in the multilayer resist method, since the lowermost resist is generally subjected to reactive ion etching from a microminiature standpoint, damage to the surface of the semiconductor may take place. In addition, in the multilayer resist method the processes are large in number and complicated, thus resulting in not only poor controllability and reproducibility but low yield and productivity. In FIG. 2, reference numerals 21 and 23 represent photoresists and reference numeral 22 represents an intermediate layer.

In order to solve the above-described problems, there is, for example, an insulating film (spacer) lift-off method shown in FIGS. 3(A) to 3(D) schematically illustrating its manufacturing processes. In the spacer lift-off method, the lower resist layer of the multilayer resist method is replaced by an insulating film 11 so that an integrated circuit is formed, after the lift-off, into a flat configuration. However, in the insulating film lift-off method, since reactive ion etching is performed for processing the insulating film, damage to the surface of the semiconductor substrate still arises. For example, when a field effect transistor (FET) is produced on a GaAs substrate in the spacer lift-off method by using a silicon nitride film as the insulating film, it was found by the present inventor that a threshold voltage (Vth) of the FET scatters widely.

SUMMARY OF THE INVENTION

Accordingly, an essential object of the present invention is to provide a semiconductor device and a method of manufacturing the semiconductor device, which eliminate all the above-described disadvantages inherent in the various conventional semiconductor devices and methods of this kind.

In order to accomplish this object of the present invention, a semiconductor device according to one aspect of the present invention comprises a semiconductor substrate; a two-layer insulating film which is formed on a surface of said semiconductor substrate and is constituted by a first insulating layer disposed on said surface of said semiconductor substrate and a second insulating layer disposed on said first insulating layer; said first and second insulating layers being, respectively, made of first and second insulating materials which are different, in chemical properties, from each other; an electrode; and a first level interconnection; said two-layer insulating film having a thickness equal to or larger than those of said electrode and said first level interconnection; said two-layer insulating film being formed with an opening such that said electrode and said first level interconnection are embedded in said opening.

Furthermore, a method of manufacturing a semiconductor device, according to another aspect of the present invention comprises the steps of: forming a two-layer insulating film on a surface of a substrate made of compound semiconductor; said two-layer insulating film being constituted by a first insulating layer and a second insulating layer such that said first and second insulating layers are, respectively, disposed on said surface of said substrate and said first insulating layer; said first and second insulating layers being, respectively, made of first and second insulating materials; forming a predetermined photoresist pattern on said second insulating layer; performing reactive ion etching of said second insulating layer through utilization of said photoresist pattern as a mask for the reactive ion etching and subsequently, performing wet etching of said first insulating layer through utilization of said photoresist pattern and said second insulating layer as a mask for the wet etching so as to form on said two-layer insulating film an opening identical, in contour, to said photoresist pattern; depositing in said opening, metal for forming both an electrode and a first level interconnection; and performing a lift-off operation.

In the semiconductor device according to the present invention, since the electrode and the first level interconnection are embedded in the two-layer insulating film, the semiconductor device is formed into a flat configuration.

Furthermore, in accordance with the present invention, since the upper insulating layer is subjected to micro processing at high accuracy by reactive ion etching having high anisotropy and the reactive ion etching is blocked by the lower insulating layer, the surface of the semiconductor substrate is protected from damage due to ion bombardment.

BRIEF DESCRIPTION OF THE DRAWINGS

These object and features of the present invention will become apparent from the following description taken in conjunction with the preferred embodiment thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 4:
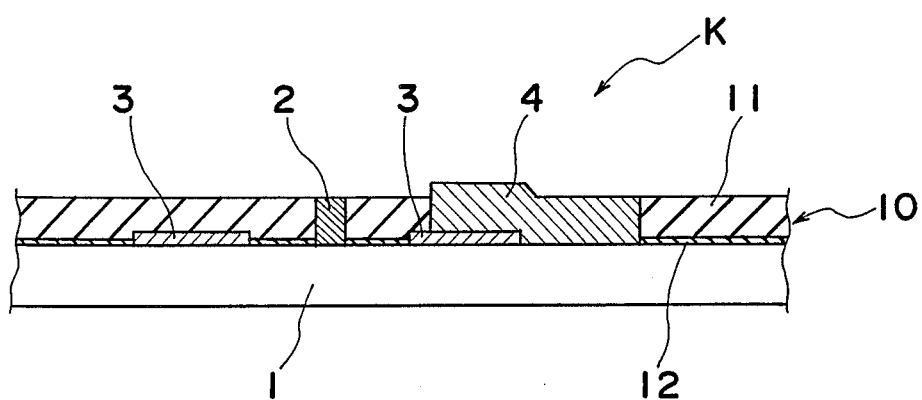
FIG. 4 is a sectional view indicative of configuration of a semiconductor device of the present invention.

Referring now to the drawings, there is shown in FIG. 4 a configuration of a semiconductor device K of the present invention. The semiconductor device K characteristically includes a semiconductor substrate 1, a two-layer insulating film 10 piled on a surface of the semiconductor substrate 1, a gate electrode 2, an ohmic electrode 3 and a first level interconnection 4. The insulating film 10 is constituted by a lower insulating layer 12 disposed on the surface of the semiconductor substrate 1 and an upper insulating layer 11 disposed on the lower insulating layer 12. The upper and lower insulating layers 11 and 12 are, respectively, made of insulating materials different, in chemical properties, from each other. The gate electrode 2, the ohmic electrode 3 and the first level interconnection 4 are embedded in an opening formed on the two-layer insulating film 10.

Hereinbelow, a method of manufacturing a semiconductor device, according to one preferred embodiment of the present invention will be described with reference to FIGS. 5(A) to 5(G). In this embodiment, a field effect transistor (FET) is produced on the semiconductor substrate 1, e.g., a GaAs substrate 1 by way of example. Initially, the lower or first insulating layer 12, e.g., a silicon dioxide ($SiO_2$) layer 12 having a thickness of 1000 Å is formed, by using an ordinary chemical vapor deposition (CVD) method, on a surface of the GaAs substrate 1 provided with an electrically conductive layer 5. Then, the upper or second insulating layer 11 made of an insulating material different from that of the $SiO_2$ layer 12, e.g., a silicon nitride (Si-N) layer 11 having a thickness of 3500 Å is formed on the $SiO_2$ layer 12 by using a plasma CVD method such that the two-layer insulating film 10 is constituted by the $SiO_2$ layer 12 and the Si-N layer 11 (FIG. 5(A)).

Figure 5:
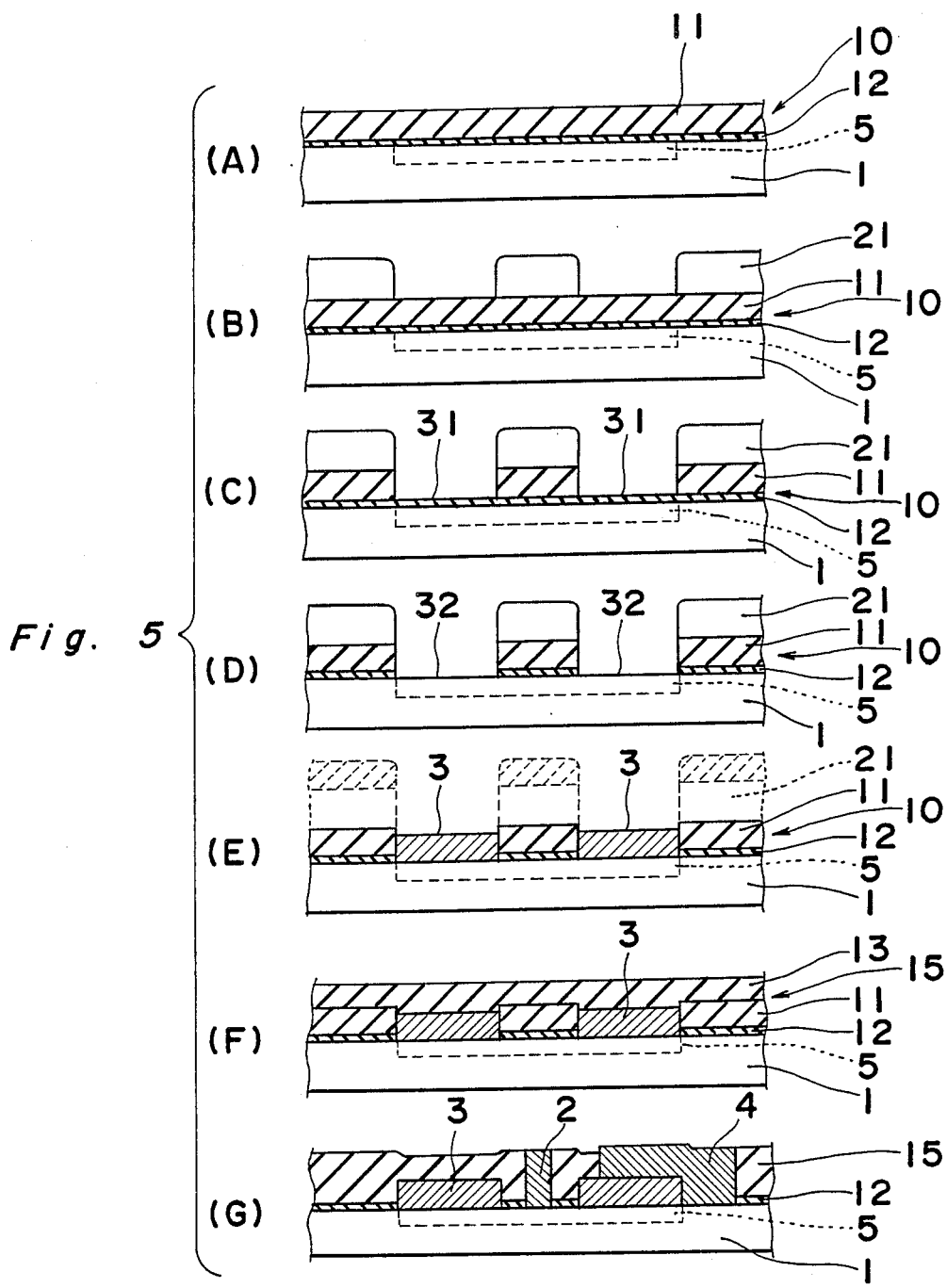
FIGS. 5(A) to 5(G) are views indicative of a method of manufacturing a semiconductor device, according to one preferred embodiment of the present invention.

Subsequently, as shown in FIG. 5(B), a predetermined photoresist pattern 21 is formed on the two-layer insulating film 10.

Then, as shown in FIG. 5(C), the upper Si-N layer 11 is subjected to reactive ion etching using, for example, plasma of carbon tetrafluoride ($CF_4$) gas at a gas pressure of $5 \times 10^{-2}$ Torr and at an electric power of 100 W for 2 min. through utilization of the photoresist pattern 21 as a mask for the reactive ion etching such that an opening 31 identical, in contour, to the photoresist pattern 21 is formed on the Si-N layer 11. At this time, since an etching speed of the lower $SiO_2$ layer 12 is one-fifth of that of the upper Si-N layer 11, the reactive ion etching is substantially blocked by the lower $SiO_2$ layer 12.

Thereafter, as shown in FIG. 5(D), the lower $SiO_2$ layer 12 is subjected to, for example, wet etching, e.g., etching for 30 sec. by using a buffer solution of hydrofluoric acid through utilization of the photoresist pattern 21 and the upper Si-N layer 11 as a mask for the wet etching such that an opening 32 identical, in contour, to teh photoresist pattern 21 is formed on the $SiO_2$ layer 12.

Immediately after the above step of FIG. 5(D), a three-layer metal film having a lower layer made of Au-Ge alloy, an intermediate layer made of Ni and an upper layer made of Au is deposited in the opening 32 to a film thickness of 4000 Å and then, a lift-off operation is performed such that an ohmic electrode 3 is formed in the opening 32 as shown in FIG. 5(E).

Subsequently, after the unfinished semiconductor device has been heat treated at 450° C., an insulating layer made of an insulating material identical to that of the Si-N layer 11, i.e., a Si-N layer 13 of 3000 Å in thickness is formed on the Si-N layer 11 by using the plasma CVD method such that the Si-N layers 11 and 13 constitute a unitary upper Si-N layer 15 as shown in FIG. 5(F).

Finally, openings are formed on the lower $SiO_2$ layer 12 and the upper Si-N layer by employing the steps shown in FIGS. 5(A) to 5(D) and then, a two-layer metal film having a lower layer made of Ti and an upper layer made of Au is deposited in the openings to a film thickness of 7000 Å. Subsequently, a lift-off operation is performed such that a gate electrode 2 and a first level interconnection 4 is formed in the openings as shown in FIG. 5(G).

Figure 1:
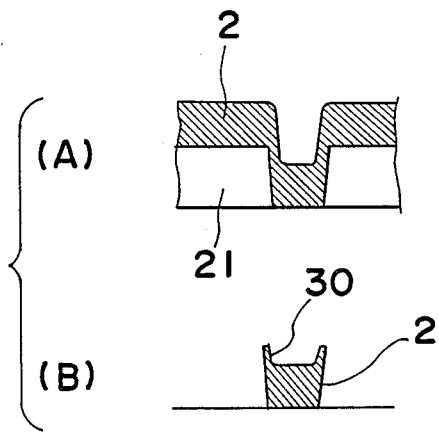
FIGS. 1(A) and 1(B) are views explanatory of formation of an electrode by the use of a prior art lift-off method (already referred to)
Figure 2:
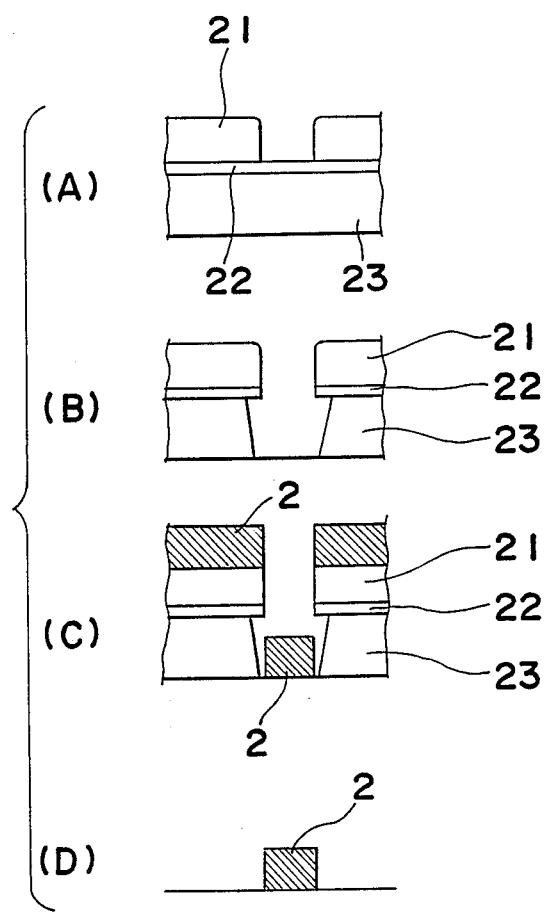
FIGS. 2(A) to 2(D) are views explanatory of a prior art multilayer resist method (already referred to)
Figure 3:
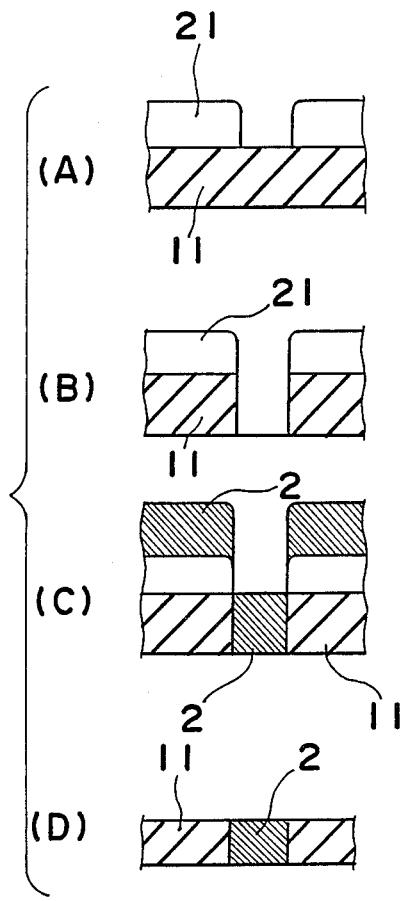
FIGS. 3(A) to 3(D) are views explanatory of a prior art insulating film (spacer) lift-off method (already referred to)
Figure 6:
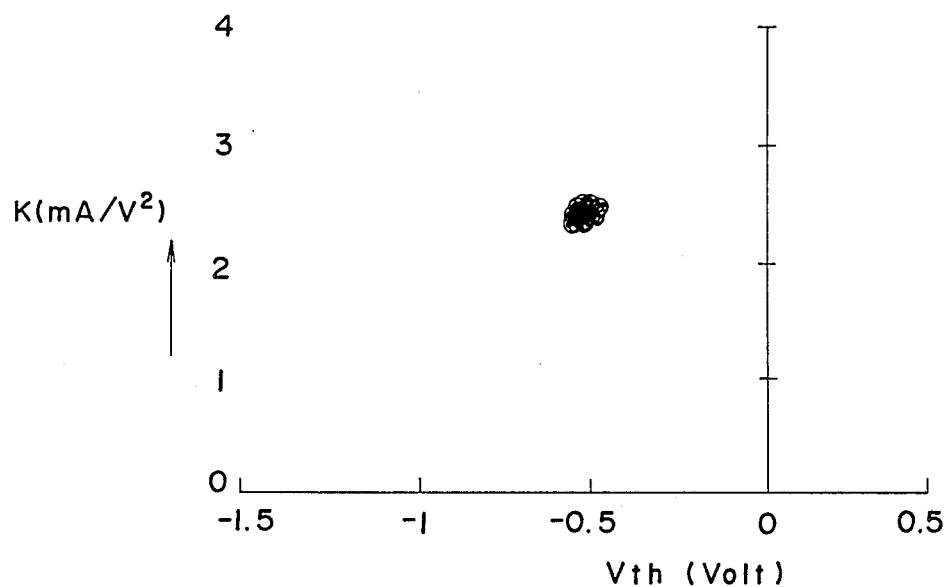
FIG. 6 is a graph indicative of distribution of threshold voltage of a field effect transistor (FET) produced by the method of the present invention on a wafer having a two-layer insulating film.
Figure 7:
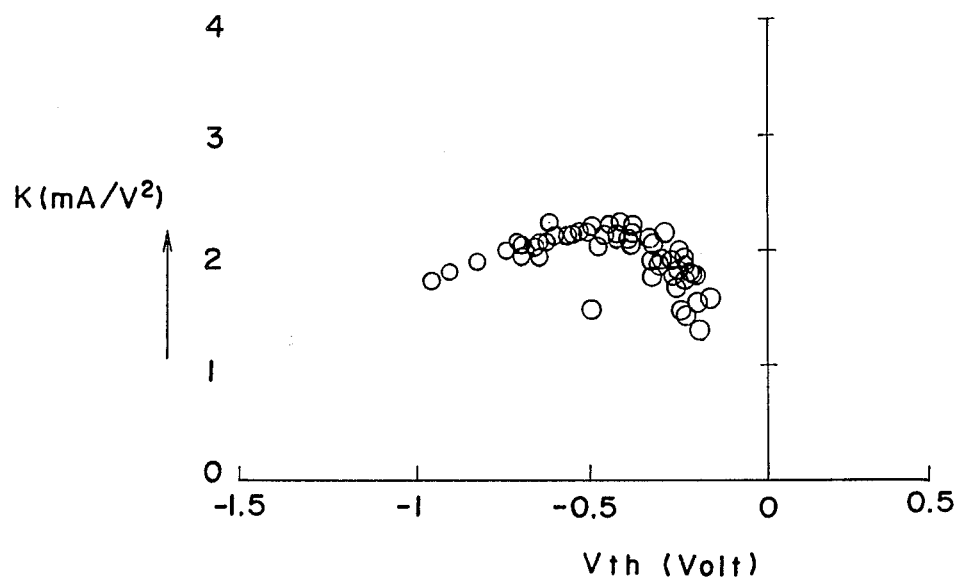
FIG. 7 is a graph similar to FIG. 6, particularly showing distribution of threshold voltage of a field effect transistor (FET) produced by the prior art insulating film (spacer) lift-off method of FIG. 3.

FIG. 6 shows distribution of threshold voltage of the field effect transistor (FET) produced, by employing the method according to the present invention, on the wafer having the two-layer insulating film. For comparison, FIG. 7 shows a typical example of distribution of threshold voltage of the FET produced in the conventional insulating film (spacer) lift-off method (FIG. 3) in which the lower insulating layer 12 is not provided. In FIGS. 6 and 7, the axis of abscissa represents threshold voltage Vth of the FET, while the axis of ordinate represents performance index K factor (mA/V$^2$) indicating current driving capability of the FET. It will be seen from FIG. 7 that the surface of the semiconductor substrate is damaged by reactive ion etching, thereby resulting in aggravation of characteristics of the FET. Effectiveness of the present invention will be understood from comparison between FIGS. 6 and 7.

The present invention has such an essential feature that when the upper and lower insulating layers of the two-layer insulating film are sequentially subjected to reactive ion etching and wet etching respectively, the upper and lower insulating layers have selectivity for reactive ion etching and wet etching, respectively. Since the object of the present invention can be accomplished if the semiconductor substrate is not damaged by etching of the lower insulating layer, etching of the lower insulating layer is not limited to wet etching of the above described embodiment. Thus, it is needless to say that plasma etching, etc. can also be employed for etching the lower insulating layer. In this connection, combination of materials of the upper and lower insulating layers of the two-layer insulating film is not restricted to that of the above described embodiment, i.e., combination of the upper insulating layer made of Si-N and the lower insulating layer made of SiO$_2$. Namely, the two-layer insulating film can be formed by the upper and lower insulating layers made of arbitrary materials, for example, the upper insulating layer made of polyimide resin, e.g., "PIQ" (name used in trade and manufactured by Hitachi Chemical Co., Ltd. of Japan) and the lower insulating layer made of Si-N or the upper insulating layer made of SiO$_2$ and the lower insulating layer made of "PIQ" or the upper insulating layer made of "PIQ" and the lower insulating layer made of SiO$_2$.

Furthermore, in the above described embodiment, when the lower insulating layer, i.e., the SiO$_2$ layer is subjected to wet etching, side etching is minimized by forming the SiO$_2$ layer into a small thickness of 1000 Å such that accuracy of micro processing is improved. However, the lower insulating layer can, needless to say, be set at an arbitrary thickness in accordance with accuracy required for micro processing.

As is clear from the foregoing description, in accordance with the present invention, the electrodes and the first level interconnection are so formed as to be embedded in the two-layer insulating film such that the semiconductor device is formed into a flat configuration.

Furthermore, in accordance with the present invention, since the upper insulating layer having a large thickness is processed by reactive ion etching having high anisotropy, it becomes possible to perform high precision micro processing of the upper insulating layer.

In addition, since the reactive ion etching is blocked by the lower insulating layer, the surface of the semiconductor substrate is protected from damage due to ion bombardment.

Moreover, in accordance with the present invention, since the lower insulating layer is subjected to wet etching so as to have a clean surface, it becomes possible to deposit metallic materials of the electrodes and the first level interconnection on the etched clean surface of the lower insulating layer.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A method of manufacturing a semiconductor device, comprising the steps of:
   forming a two-layer insulating film on a surface of a substrate made of compound semiconductor;
   said two-layer insulating film being constituted by a first insulating layer and a second insulating layer such that said first and second insulating layers are, respectively, disposed on said surface of said substrate and said first insulating layer and have different chemical properties so that the ion etching speed of said first layer is less than the ion etching speed of said second layer;
   said first and second insulating layers being, respectively, made of first and second insulating materials;
   forming a predetermined photoresist pattern on said second insulating layer;
   performing reactive ion etching of said second insulating layer through utilization of said photoresist pattern as a mask for the reactive etching, said first layer substantially blocking said substrate from ion bombardment and subsequently, performing wet etching of said first insulating layer through utilization of said photoresist pattern and said second insulating layer as a mask for the wet etching so as to form on said two-layer insulating film an opening identical, in contour, to said photoresist pattern;
   depositing in said opening metal for forming both an electrode and a first level interconnection; and
   lifting off said metal so that an electrode and a first level interconnection are formed.

2. A method as claimed in claim 1, wherein said first and second insulating layers are, respectively, made of silicon oxide and silicon nitride.

3. A method as claimed in claim 1, wherein said first and second insulating layers are, respectively, made of silicon oxide and polyimide resin.

4. A method as claimed in claim 2, wherein said first insulating layer has a thickness of not more than 2000 Å.

5. A method as claimed in claim 3, wherein said first insulating layer has a thickness of not more than 2000 Å.

* * * * *